United States Patent
Richter et al.

(10) Patent No.: US 11,362,164 B2
(45) Date of Patent: Jun. 14, 2022

(54) METHOD FOR THE PRODUCTION OF A SEMI-TRANSPARENT DISPLAY, AND A SEMI-TRANSPARENT DISPLAY

(71) Applicant: Fraunhofer-Gesellschaft zur Förderung der angewandten Forschung e.V., Munich (DE)

(72) Inventors: Bernd Richter, Dresden (DE); Philipp Wartenberg, Dresden (DE); Stephan Brenner, Dresden (DE); Volker Kirchhoff, Dresden (DE); Uwe Vogel, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/768,512

(22) PCT Filed: Dec. 11, 2018

(86) PCT No.: PCT/EP2018/084349
§ 371 (c)(1),
(2) Date: May 29, 2020

(87) PCT Pub. No.: WO2019/115518
PCT Pub. Date: Jun. 20, 2019

(65) Prior Publication Data
US 2020/0303486 A1 Sep. 24, 2020

(30) Foreign Application Priority Data
Dec. 12, 2017 (DE) .................. 10 2017 129 524.0

(51) Int. Cl.
*H01L 27/32* (2006.01)
*H01L 27/12* (2006.01)
*H01L 51/56* (2006.01)

(52) U.S. Cl.
CPC ........ *H01L 27/3276* (2013.01); *H01L 27/124* (2013.01); *H01L 27/127* (2013.01); *H01L 51/56* (2013.01)

(58) Field of Classification Search
CPC . H01L 27/3276; H01L 27/124; H01L 27/127; H01L 51/56
(Continued)

(56) References Cited

U.S. PATENT DOCUMENTS

| 5,317,236 A | 5/1994 | Zavracky et al. |
| 2009/0239320 A1* | 9/2009 | Takayama ........... H01L 27/1266 438/27 |

(Continued)

FOREIGN PATENT DOCUMENTS

| DE | 101 41 571 A1 | 3/2003 |
| EP | 1 480 272 A2 | 11/2004 |
| WO | WO 2013/062707 A1 | 5/2013 |

OTHER PUBLICATIONS

International Search Report, issued in International Application No. PCT/2018/084349, dated Mar. 14, 2019, pp. 1-2, European Patent Office, Rijswijk, Netherlands.

*Primary Examiner* — Dzung Tran
(74) *Attorney, Agent, or Firm* — Crowell & Moring LLP

(57) ABSTRACT

Provided is a semi-transparent display and a method for producing a semi-transparent display. An SOI wafer is provided, the surface having at least one pixel region and at least one contact region arranged next to the pixel region, the SOI wafer comprising a silicon substrate on the rear side. At least one electromagnetic-radiation-emitting layer is deposited on the front side of the SOI wafer. At least one (Continued)

transparent cover layer is applied above the at least one electromagnetic-radiation-emitting layer. A wiring carrier is fastened to the assembly comprising the SOI wafer, the electromagnetic-radiation-emitting layer and the transparent cover layer. Before fastening of the wiring carrier to the assembly, the silicon substrate is removed from the assembly, producing a residual assembly, and electrically conductive connections are formed between the contact region of the SOI wafer and the wiring carrier from the rear side of the SOI wafer.

12 Claims, 7 Drawing Sheets

(58) Field of Classification Search
USPC .......................................................... 257/40
See application file for complete search history.

(56) References Cited

U.S. PATENT DOCUMENTS

| 2010/0032783 | A1 | 2/2010 | Swain et al. | |
|---|---|---|---|---|
| 2010/0045919 | A1 | 2/2010 | Chida et al. | |
| 2013/0240855 | A1* | 9/2013 | Chida | H01L 51/56 |
| | | | | 257/40 |
| 2014/0273317 | A1* | 9/2014 | Chida | H01L 33/20 |
| | | | | 438/26 |
| 2015/0250038 | A1 | 9/2015 | Sakuishi et al. | |
| 2015/0263314 | A1* | 9/2015 | Sakuishi | H01L 51/003 |
| | | | | 438/28 |
| 2015/0309637 | A1 | 10/2015 | Sakuishi et al. | |
| 2017/0330903 | A1* | 11/2017 | Chida | H01L 27/124 |

\* cited by examiner

METHOD FOR THE PRODUCTION OF A SEMI-TRANSPARENT DISPLAY, AND A SEMI-TRANSPARENT DISPLAY

CROSS-REFERENCE TO RELATED APPLICATIONS

This application is a 371 nationalization of international patent application PCT/EP2018/084349 filed Dec. 11, 2018, which claims priority under 35 USC § 119 to German patent application DE 10 2017 129 524.0 filed Dec. 12, 2017. The entire contents of each of the above-identified applications are hereby incorporated by reference.

DESCRIPTION

Figure 1:
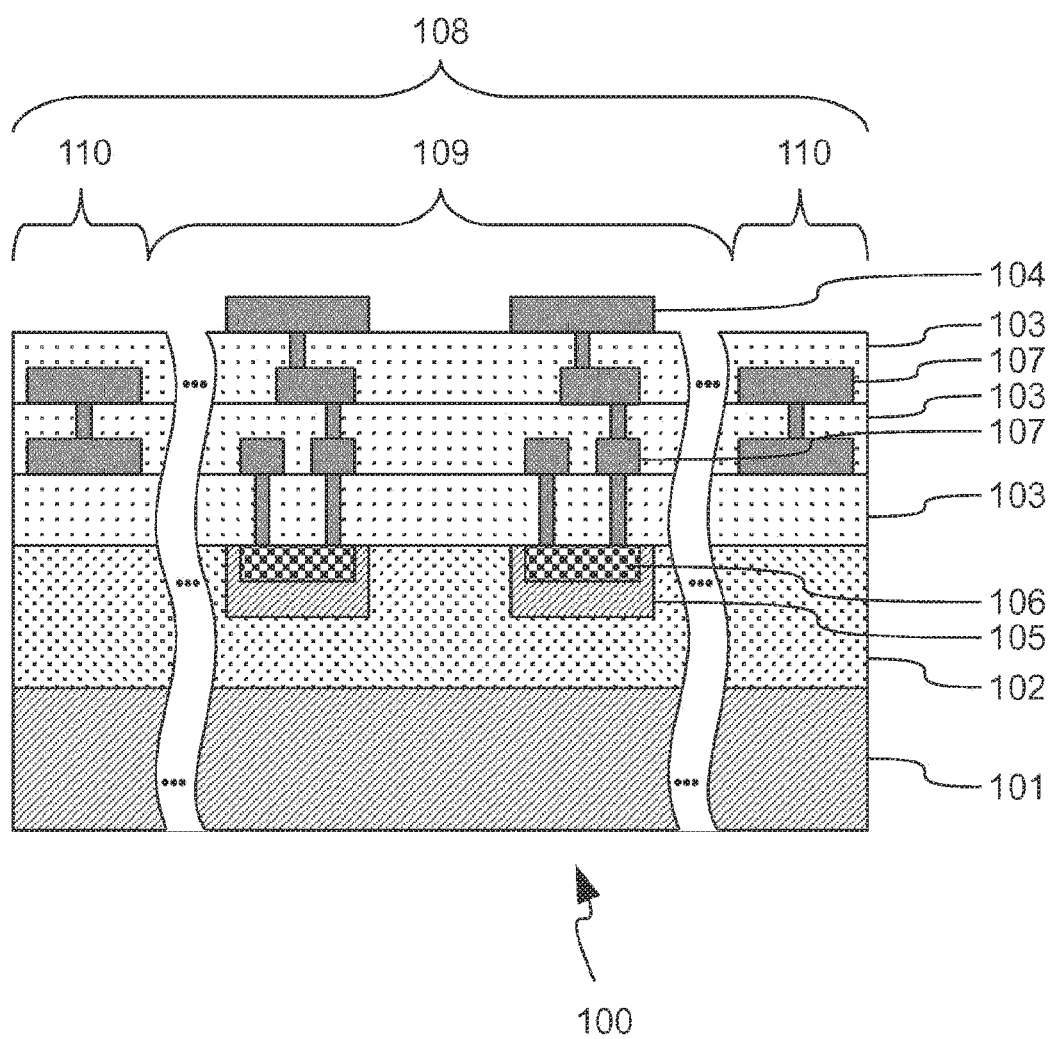
FIG. 1 a schematic sectional representation of an SOI wafer suitable for a display design, FIG. 2 a schematic sectional representation of an SOI wafer, to which a electromagnetic radiation emitting layer is deposited and a cover layer is applied, FIG. 3 a schematic sectional representation of the assembly from FIG. 2, from which the silicon substrate has been removed, FIG. 4 a schematic sectional representation of the residual assembly from FIG. 3 on which electrically conductive elements have been exposed, FIG. 5 a schematic sectional representation of the residual assembly from FIG. 4, to the front of which a wiring carrier is attached, FIG. 6 a schematic sectional representation of the residual assembly from FIG. 4, to the rear side of which a wiring carrier is attached, FIG. 7 a schematic representation of the rear side of a residual assembly, to the front of which a wiring carrier is attached.

The invention relates to a method for the production of a semi-transparent display, and the semi-transparent display itself. A semi-transparent display in the sense of invention is to be a display that comprises a plurality of first surface areas, within which light that is detectable with a human eye can be transmitted through the display from both sides. Furthermore, a semi-transparent display comprises a plurality of second surface areas, within which light that is detectable with a human eye cannot be transmitted through the display.

Displays are becoming increasingly important for the presentation of information. Transparent and/or semi-transparent displays have many advantages if such information is to be displayed in a person's field of vision, e.g. while wearing glasses or when using binoculars.

A state-of-the-art wafer is often used as a basis for the production of a display, with a layer of electrically nonconducting material being deposited on a silicon substrate of such wafers. In this process, the silicon substrate gives the wafer its mechanical stability and represents the rear side of such a wafer for the purposes of the following illustrating descriptions. The layer of electrically nonconducting material in turn comprises a plurality of silicon-based active areas, within which transistors and/or electrical circuits are constructed. These transistors and/or electrical circuits can be used to control the individual pixels of the display. Due to the arrangement of silicon-based active areas on or within an insulator layer, such a technology and such wafers are also known in English as "silicon-on-insulator" or by the abbreviation "SOI". An SOI wafer further comprises at least one layer arranged above the active areas, usually consisting of a transparent oxide, which contains electrically conducting connections between the connections of the electrical circuits from the silicon-based active regions. In SOI wafers, several such oxide layers are also often deposited one above the other, and within each layer several wiring levels are then formed.

Relative to the surface of an SOI wafer, which is used for the production of a display, it is usually subdivided into at least one pixel area and at least one contact area, with the display showing the image being designed within the pixel, and electrically conductive connections to external components being subsequently constructed within the contact area. Due to the silicon substrate, SOI wafers are usually opaque to light that can be detected with a human eye.

Methods for the production of a semi-transparent LCD display are described in US 005317236 A, wherein SOI wafers are used as a basis for the display structure, on which an electroluminescent layer and a counter electrode layer are deposited. To achieve the transparency of the display, it is proposed to remove the silicon substrate of the SOI wafer and to replace it with a transparent substrate such as glass, for example. A disadvantage of the process is that electrically conductive connections from the contact area of the SOI wafer to other components, such as a wiring carrier, can only be made from the front side of the SOI wafer, which limits their possible applications.

The technical problem underlying the invention is therefore to create a method for the production of a semi-transparent display, and such a semi-transparent display itself, to overcome the disadvantages of the prior state of the art. In particular, the method described in this invention should be able to form contact options to other components on the rear side of the display described in this invention.

In the method as described in the invention, at least one electromagnetic radiation emitting layer is deposited on the front side of the SOI wafer known from prior state of the art. The at least one electromagnetic radiation emitting layer is preferably designed as an organic layer, but can by alternative also be an inorganic layer. To ensure that the electromagnetic radiation emitting layer in a display can actually emit electromagnetic radiation, pixel electrodes and pixel counter electrodes adjacent to the layer are required.

In one embodiment of the invention, the pixel electrodes and pixel counter electrodes for the at least one electromagnetic radiation emitting layer are arranged on one level and are designed to be a component of the SOI wafer.

Alternatively, only the pixel electrodes may be configured as a component of the SOI wafer, with an additional electrically conductive layer above and adjacent to at least one electromagnetic radiation emitting layer being deposited, which acts as a counter electrode. Alternatively, this electrically conductive layer can also be configured as a partial layer and be a top component of the at least one electromagnetic radiation emitting layer. In another embodiment the electrically conductive layer and/or the electrically conductive partial layer is structured in such a way that at least one pixel counter electrode can be assigned to each pixel.

It is known that organic layers emitting electromagnetic radiation often consist of a plurality of partial layers that may also be deposited as organic layers in the method described in the invention. Some of these partial layers which such a layer may include, with the related technical terms in English and the associated abbreviations in brackets, are listed in the following merely by way of example:

Hole Injection Layer (HIL), Hole Transport Layer (HTL), Electron Blocking Layer (EBL), Emission Layer (EML), Hole Blocking Layer (HBL), Electron Transport Layer (ETL).

At least one transparent cover layer is applied above the at least one electromagnetic radiation emitting layer. The transparent cover layer can be designed as glass or plastic film, for example. An assembly is thus obtained as an intermediate, comprising at least the SOI wafer, the electromagnetic radiation emitting layer and the transparent cover layer. Additional layers, such as barrier layers or coupling layers, can also be deposited between the SOI wafer, the electromagnetic radiation emitting layer and the transparent cover layer.

According to the invention, the silicon substrate of the SOI wafer is removed from the assembly, thus creating a residual assembly. The silicon substrate can for example be mechanically abraded and/or chemically removed from the assembly. The silicon substrate, which was present on the SOI wafer mainly due to its mechanical stability, is not required for the mechanical stability of the residual assembly of a display as described in the invention because the cover layer, which can be designed as a glass or plastic film, guarantees sufficient mechanical stability of the residual assembly without using a silicon substrate.

Removing the silicon substrate from the assembly also causes the residual assembly to be semi-transparent without using a silicon substrate. This means that, at least in the areas of the residual assembly, where no transistors and/or no electrical circuits and no electrically conducting connections are located, light detectable by a human eye can be transmitted through the residual assembly from either side, which was not possible before the silicon substrate was removed.

After removing the silicon substrate from the SOI wafer, in one embodiment an opaque layer can be deposited and structured on the rear side of the residual SOI wafer, for example to shield the pixel circuit against incoming electromagnetic radiation that can be disturbing. Transparency is thus maintained in areas outside of the pixel circuit.

After removal of the silicon substrate from the assembly, a wiring carrier is attached to the front side or rear side of the residual assembly as described in the invention. A wiring carrier can for example be constructed in the form of a printed circuit board.

If the wiring carrier is attached on the front side of the residual assembly, from which electromagnetic radiation is emitted in the pixel area, the wiring carrier comprises a recess at least in the pixel area.

According to the invention, electrically conductive connections are formed between the contact area of the former SOI wafer, which is now only partially part of the residual assembly, and the wiring carrier from the rear side of the SOI wafer. This is now possible because the silicon substrate was previously removed, so that now contact elements and/or electrically conductive elements, primarily from the lowest wiring level, can be exposed on the rear side within the contact area using known processing steps. If the wiring carrier is attached to the front side of the residual assembly, electrically conductive connections between the contact area and the wiring carrier can be configured, e.g. as wire bond. If the wiring carrier is attached to the rear of the residual assembly, electrically conductive connections can be configured between the contact area and the wiring carrier, e.g. as a bump bond or anisotropically conductive bond.

The invention is described in greater detail below using exemplary embodiments.

An SOI wafer 100 known from the prior state-of-the-art that is suitable for a display structure is schematically represented as a sectional drawing in FIG. 1. The SOI wafer 100 comprises, in that order, a silicon substrate 101 on its rear side, a transparent layer 102 made of an electrically nonconducting material, and several transparent silicon oxide layers 103, on the surface of which contacts 104 are configured to function as pixel electrodes. A plurality of silicon-based active regions 105 is incorporated within the layer 102 of electrically nonconducting material, within which electrical circuits 106 are configured to control pixel cells. Furthermore, electrically conductive elements 107 are configured within the silicon oxide layers 103, extending for example between the connections of the circuits 106 and/or from the connections of the circuits 106 to the contacts 104.

The structure of an SOI wafer shown in FIG. 1 is merely an example. Alternatively, an SOI wafer known from prior state of the art may also have a different structure. Thus, active areas of an SOI wafer may not be configured within the layer 102, for example, but on top of the layer 102. Please note, therefore, that all SOI wafers known from prior state of the art that are suitable for constructing a display can also be used for the method as described in the invention and for the construction of a display as described in the invention.

The SOI wafer 100 is subdivided into a pixel area 109 and a contact area 110. In the exemplary embodiment shown in FIG. 1 the contact area 110 completely encloses the pixel region 109. For the purpose of clarity, the sectional representations shown in FIGS. 1 to 6 only show an extract from the pixel area of an SOI wafer 100, which merely comprises two silicon-based active regions 105. A complete pixel area can contain several thousand such silicon-based active regions 105 side by side, however.

Figure 2:
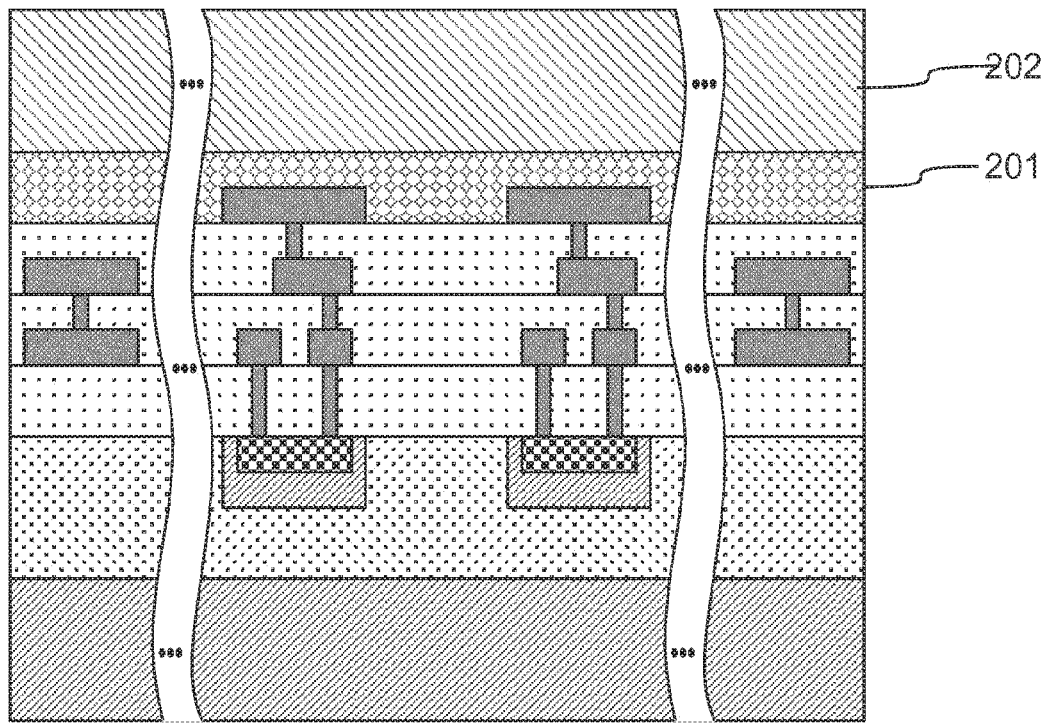

FIG. 2 shows a schematic sectional representation of how a transparent electromagnetic radiation emitting layer 201 is deposited using known process steps as described in the invention, and then a transparent covering layer 202, which in the exemplary embodiment is made of glass, thus producing an assembly consisting of the SOI wafer 100, the layer 201 and the cover layer 202. In the exemplary embodiment, the layer 201 emitting electromagnetic radiation is designed as an organic layer and consists of a plurality of known partial layers as previously described. Furthermore, the layer 201 comprises a partial layer made of an electrically conductive material as a top termination, wherein the partial layer made of the electrically conductive material is structured as required by the pixel arrangement of the resulting display and acts as a pixel counter electrode.

Figure 3:
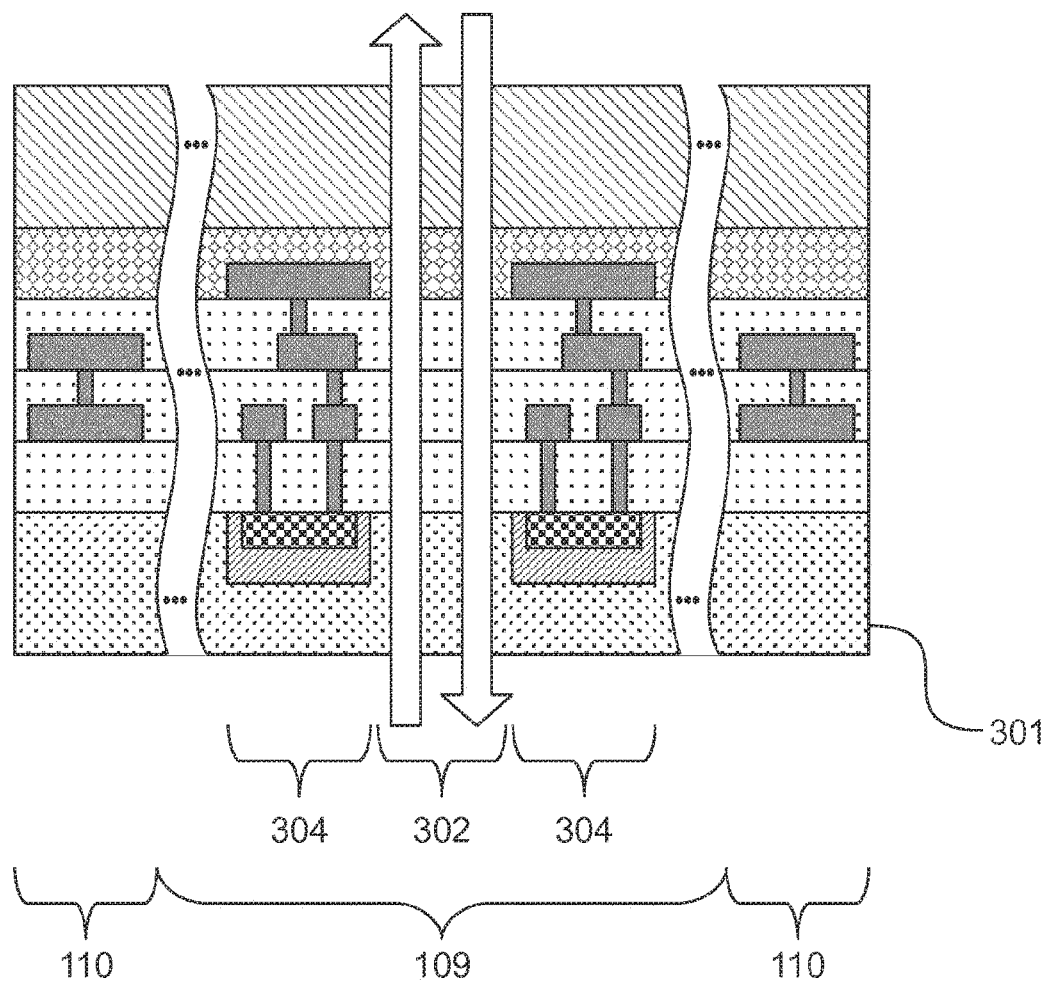
Figure 4:
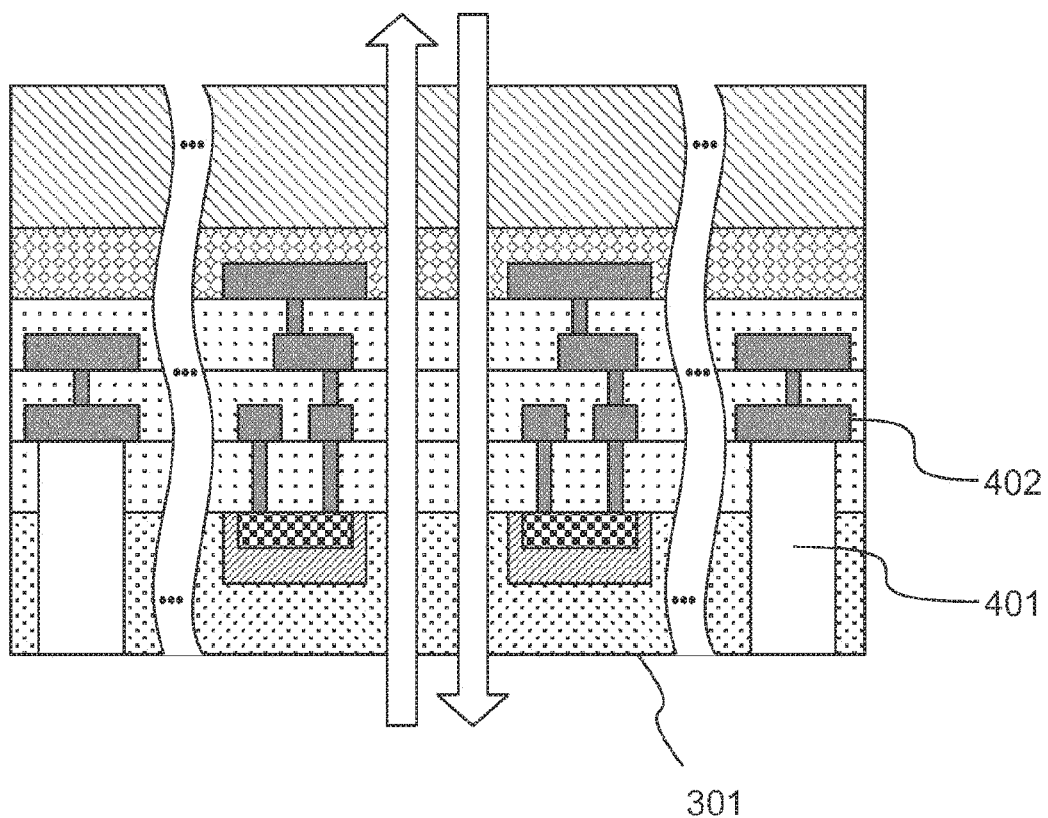

According to the invention, upon production of the assembly consisting of the silicon substrate 101, the layer 201 and the cover layer 202 the silicon substrate is removed from the assembly of the original SOI wafer 100. As a result, a residual assembly 301 is formed, a schematic sectional representation of which is shown in FIG. 3 and which is semi-transparent. This means that the residual assembly 301 is transparent for light detectable with a human eye at least in the subsections 302 of the pixel area 109 where no circuit elements and no electrically conductive elements are situated, as represented by the two arrows in FIG. 3. Furthermore, the residual assembly 301 also comprises subsections, such as the contact areas 110 and the subsections 303 of the pixel region 109, within which circuit elements and/or electrically conductive elements are situated and which are thus less transparent than the sub-sections 302.

In addition to the resulting semi-transparency of the residual assembly 301, the removal of the silicon substrate 100 is associated with an additional advantage. It is now possible to form recesses 401 on the rear side of the residual assembly 301 using known method steps, exposing electrically conductive elements 402 within the contact area 110 of the lowest wiring level, as shown as a schematic sectional representation in FIG. 4.

Figure 5:
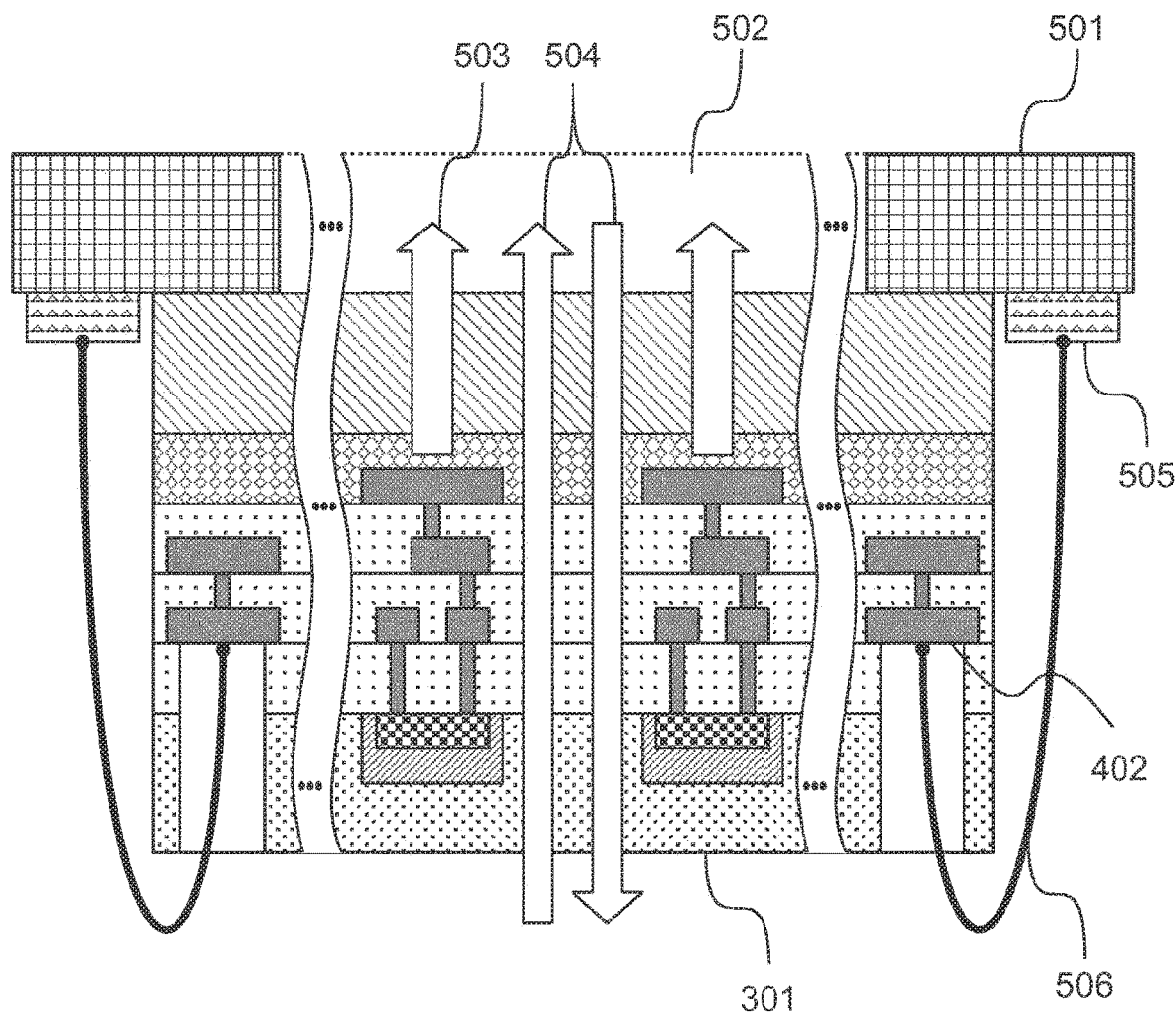

FIG. 5 shows a schematic sectional representation of the method by which a wiring carrier 501 is attached to the front side of the residual assembly 301. The wiring carrier 501 shows a recess 502 in the pixel area of the residual assembly 301, through which electromagnetic radiation 503 from the display pixels and light 508 passing through the residual assembly 308 can be transmitted. Furthermore, FIG. 5 shows that contact elements 505 of a wiring carrier 501 attached to the front side, for example using wire bonds 506, can be connected to the electrically conductive elements 402 exposed at the rear side.

Figure 6:
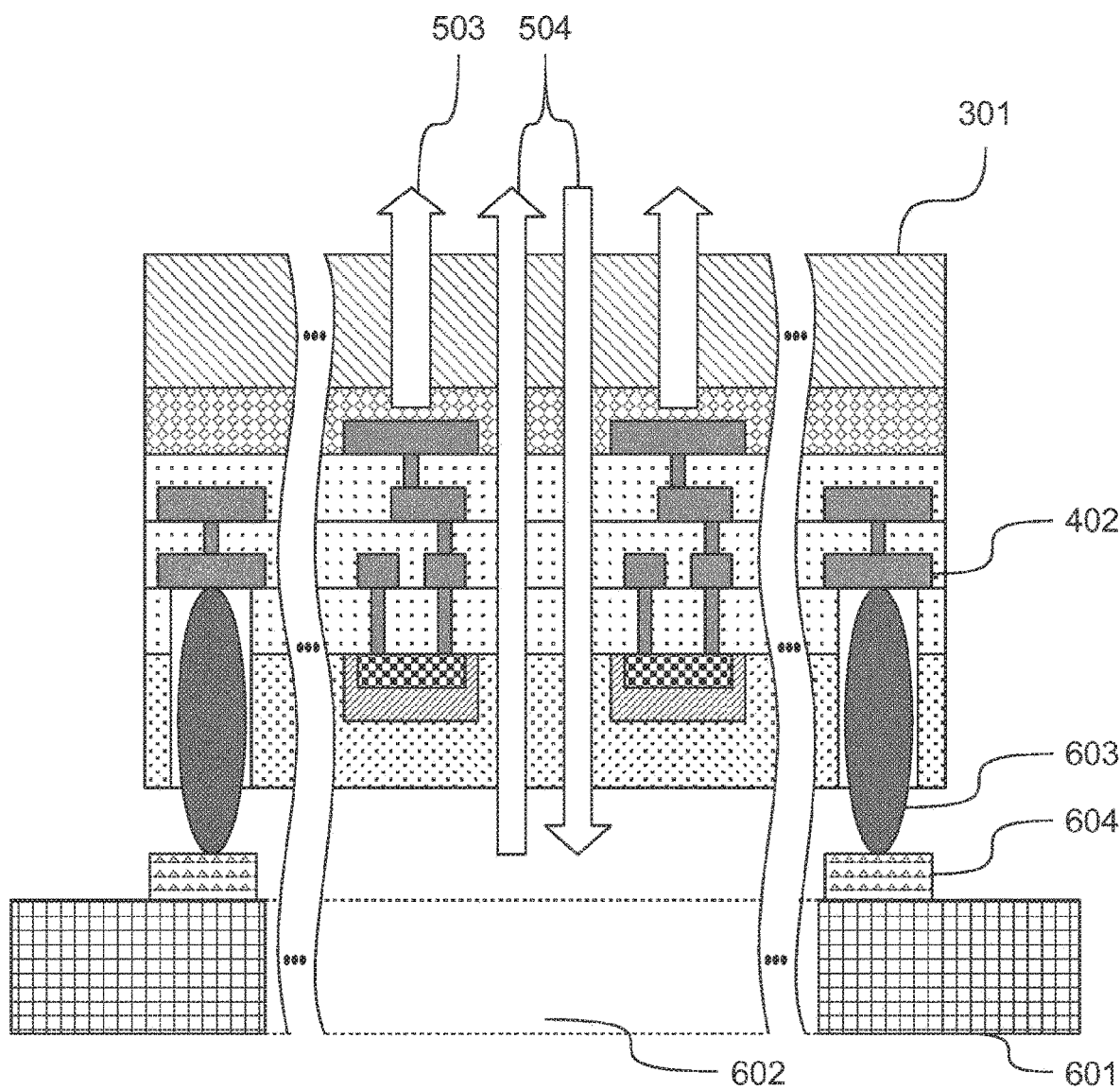

An alternative display structure as described in the invention is shown as a schematic sectional representation in FIG. 6. A wiring carrier 601 was attached to the rear side of the residual assembly 301 known from FIG. 4 in an alternative procedure. The wiring carrier 601 also comprises a recess 602 in the pixel area of the residual assembly 301. Alternatively, in the case of a wiring carrier attached to the rear side, no recess may be present in the pixel area if the semi-transparent property is not required in a display. In the embodiment shown in FIG. 6, the electrically conductive elements 402 of the residual assembly 301 exposed on the rear side have electrically conductive connections with the contact elements 604 of the wiring carrier 601 using so-called bump bonds 603.

Figure 7:
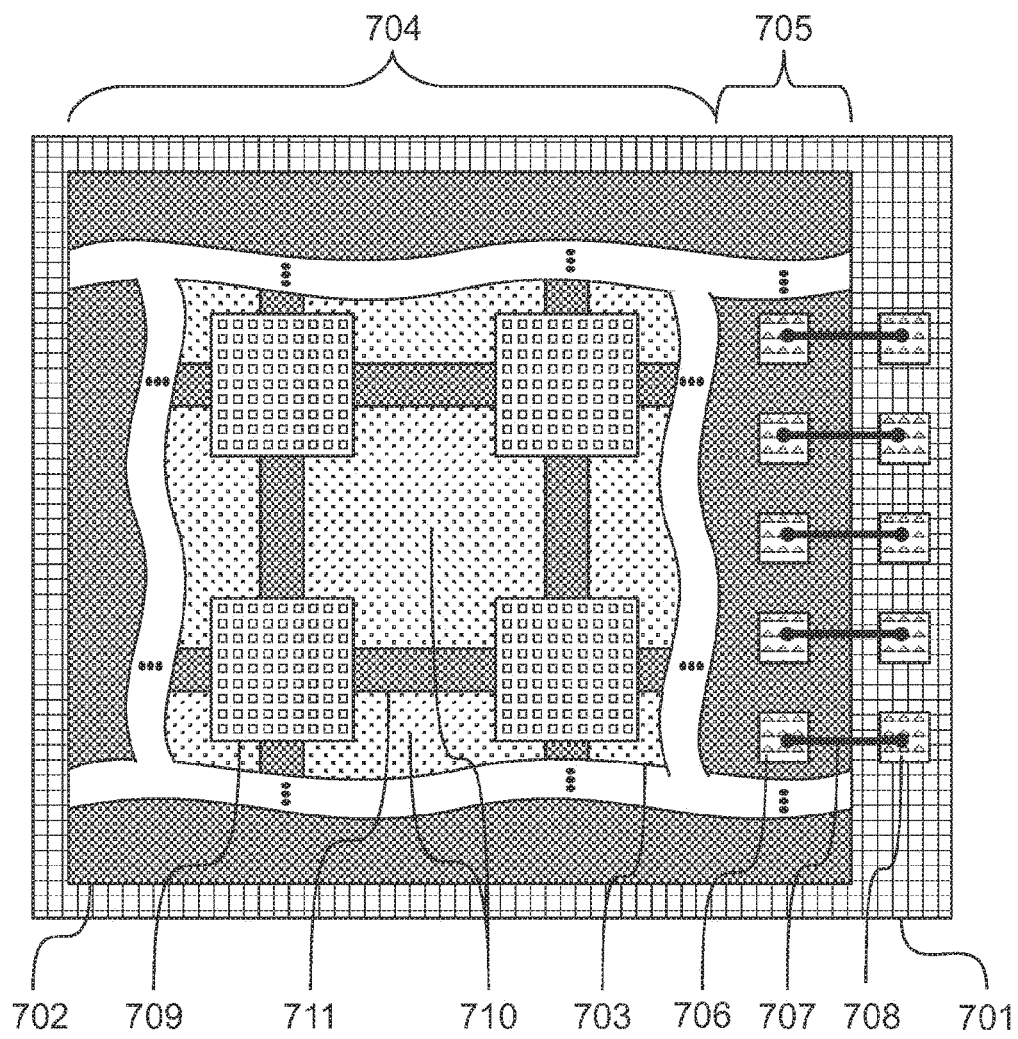

Finally, FIG. 7 shows once again a schematic display structure as described in the invention seen from the rear, in which a wiring carrier 701 is attached to the front of a residual assembly 702, wherein a significantly magnified detail section 703 of a pixel section 704 of the residual assembly 702 is shown for better illustration. In addition to the pixel area 704, the residual assembly 702 also comprises a contact region 705. Electrically conductive elements 706 exposed on the rear side within the contact region 705 have electrically conductive connections with the contact elements 708 of the wiring carrier 701 using wire bonds 707.

The detailed cross-sectional representation 703 only shows four pixels 709 for better clarity. The detailed cross-sectional representation 703 is to illustrate once again that there is a plurality of sub-regions 710 in a display as described in the invention between the pixels 709, within which no circuits to control the pixels 709 are situated, and no electrically conductive connections 711 are configured, so that the subsections 710 are transparent. As the surface areas of a display as described in the invention, within which e.g. circuits or electrodes to control the pixels 709 or electrically conductive connections 711 are situated, has at least a lower or even severely limited transparency compared to the subregions 710, a display as described in the invention is referred to as a semi-transparent display.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. A method for the production of a semi-transparent display, comprising the following process steps:
    providing an SOI wafer whose surface comprises a pixel region and a contact region arranged next to the pixel region, wherein the SOI wafer comprises a silicon substrate on the rear side of the SOI wafer;
    depositing at least one electromagnetic radiation emitting layer on the front side of the SOI wafer;
    applying at least one transparent cover layer above the at least one electromagnetic radiation emitting layer;
    attaching a wiring carrier to the assembly comprising the at least the SOI wafer, the electromagnetic radiation emitting layer, and the transparent layer; and
    leaving a plurality of subsections of the pixel region in which no circuit elements and no electrically conductive elements are situated, the subsections permitting light detectable with a human eye to pass from a front side of the semi-transparent display to a rear side of the semi-transparent display, the semi-transparent display comprising the wiring carrier, the at least the SOI wafer, the electromagnetic radiation emitting layer, and the transparent layer;
    wherein prior to attaching the wiring carrier to the assembly comprising the SOI wafer, the electromagnetic radiation emitting layer, and the transparent cover layer, the silicon substrate is removed from the assembly, thus producing a residual assembly and electrically conductive connections are formed between the contact region of the SOI wafer and the wiring carrier from the rear side of the SOI wafer.

2. The method of claim 1, wherein the wiring carrier is attached to the front side of the residual assembly.

3. The method of claim 2, wherein electrically conductive connections between the contact region of the SOI wafer and the wiring carrier comprise a wire bond.

4. The method of claim 1, wherein the wiring carrier is attached to the rear side of the residual assembly.

5. The method of claim 4, wherein electrically conductive connections between the contact region of the SOI wafer and the wiring carrier include a bump bond or an anisotropically conducting bond.

6. The method of claim 1, wherein the at least one electromagnetic radiation emitting layer is formed as an organic layer.

7. The method of claim 1, wherein the at least one electromagnetic radiation emitting layer is formed as an inorganic layer.

8. The method of claim 1, wherein the silicon substrate is mechanically abraded from the assembly and/or that the silicon substrate is chemically removed from the assembly.

9. The method of claim 1, wherein at least one transparent cover layer is formed as glass or a polymer film.

10. The method of claim 1, wherein pixel electrodes and pixel counter electrodes for the at least one electromagnetic radiation emitting layer are arranged on one level and designed as a component of the SOI wafer.

11. The method of claim 1, wherein pixel electrodes are included in the SOI wafer, wherein one electrically conductive layer is deposited above and adjacent to the at least one electromagnetic radiation emitting layer, or as a top component of the electrically conductive layer.

12. The method of claim 11, wherein the electrically conductive layer is structured.

\* \* \* \* \*